United States Patent
Anella et al.

(10) Patent No.: US 10,109,510 B2
(45) Date of Patent: Oct. 23, 2018

(54) APPARATUS FOR IMPROVING TEMPERATURE UNIFORMITY OF A WORKPIECE

(71) Applicant: Varian Semiconductor Equipment Associates, Inc., Gloucester, MA (US)

(72) Inventors: Steven M. Anella, West Newbury, MA (US); Michael A. Schrameyer, Beverly, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 47 days.

(21) Appl. No.: 14/575,651

(22) Filed: Dec. 18, 2014

(65) Prior Publication Data

US 2016/0181132 A1 Jun. 23, 2016

(51) Int. Cl.
| H01L 21/67 | (2006.01) |
| H01L 21/324 | (2006.01) |
| H01L 21/683 | (2006.01) |
| H05B 3/00 | (2006.01) |
| H01L 21/687 | (2006.01) |
| H05B 3/26 | (2006.01) |

(52) U.S. Cl.
CPC ...... *H01L 21/67103* (2013.01); *H01L 21/324* (2013.01); *H01L 21/67109* (2013.01); *H01L 21/67248* (2013.01); *H01L 21/683* (2013.01); *H01L 21/68735* (2013.01); *H05B 3/0047* (2013.01); *H05B 3/265* (2013.01); *H05B 2203/014* (2013.01)

(58) Field of Classification Search
USPC ............... 118/728–732; 156/345.51–345.55
See application file for complete search history.

(56) References Cited

U.S. PATENT DOCUMENTS

| 6,084,213 A | 7/2000 | Kohav et al. |
| 6,475,336 B1* | 11/2002 | Hubacek ............ C23C 16/4585 118/723 E |
| 6,838,645 B2 | 1/2005 | Choi et al. |
| 2002/0171994 A1 | 11/2002 | Grimard et al. |
| 2003/0140853 A1* | 7/2003 | Wada ..................... C23C 16/46 118/715 |
| 2004/0060917 A1 | 4/2004 | Liu et al. |
| 2005/0045616 A1 | 3/2005 | Ishihara |

(Continued)

FOREIGN PATENT DOCUMENTS

JP 2003-142419 A 5/2003

OTHER PUBLICATIONS

International Search Report and Written Opinion dated Mar. 15, 2016 in corresponding PCT application No. PCT/US2015/062182.

*Primary Examiner* — Parviz Hassanzadeh
*Assistant Examiner* — Tiffany Z Nuckols
(74) *Attorney, Agent, or Firm* — Nields, Lemack & Frame, LLC

(57) ABSTRACT

An apparatus and method for improving the temperature uniformity of a workpiece during processing is disclosed. The apparatus includes a ring heater assembly disposed along the outer circumference of the platen. The ring heater assembly includes heating elements disposed therein or thereon, where these heating elements create heat, which serves to warm the outer edge of the workpiece. In some embodiments, the ring heater assembly extends beyond the edge of the workpiece and may be exposed to the ion beam.

17 Claims, 6 Drawing Sheets

(56) References Cited

U.S. PATENT DOCUMENTS

| | | | |
|---|---|---|---|
| 2005/0133165 A1* | 6/2005 | Liu | C23C 16/4401 156/345.51 |
| 2006/0075972 A1* | 4/2006 | Nakashima | C23C 16/4584 118/729 |
| 2007/0221657 A1* | 9/2007 | Arai | H01L 21/67103 219/501 |
| 2009/0238971 A1* | 9/2009 | Higashi | C23C 16/4584 427/255.5 |
| 2010/0000970 A1* | 1/2010 | Koshimizu | H01J 37/32522 216/67 |
| 2010/0243620 A1* | 9/2010 | Yamawaku | H01J 37/32623 219/121.54 |
| 2010/0326600 A1* | 12/2010 | Park | H01J 37/32091 156/345.37 |
| 2010/0326957 A1* | 12/2010 | Maeda | H01J 37/20 216/67 |
| 2011/0014789 A1* | 1/2011 | Suzuki | C23C 16/46 438/680 |
| 2012/0281334 A1* | 11/2012 | Sasaki | H01L 21/6831 361/234 |
| 2012/0291697 A1* | 11/2012 | Suzuki | C30B 25/10 117/98 |
| 2013/0164948 A1 | 6/2013 | Romero et al. | |
| 2013/0175005 A1 | 7/2013 | Gowdaru et al. | |

* cited by examiner

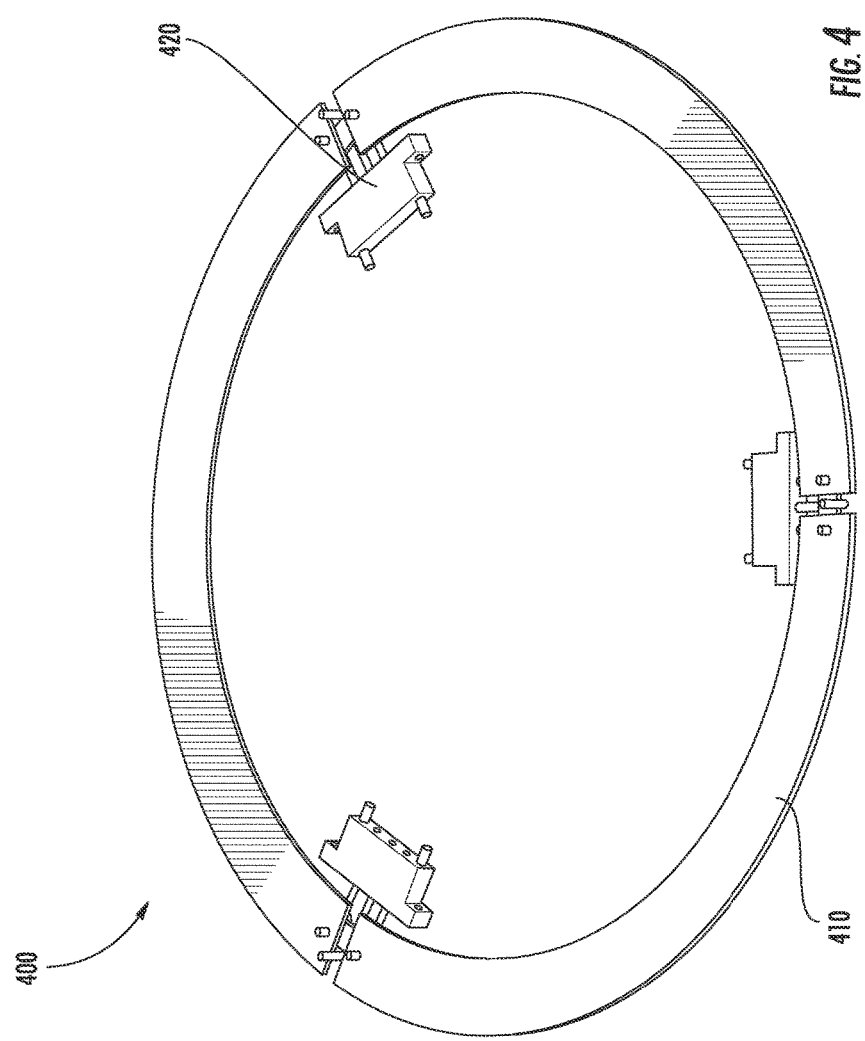

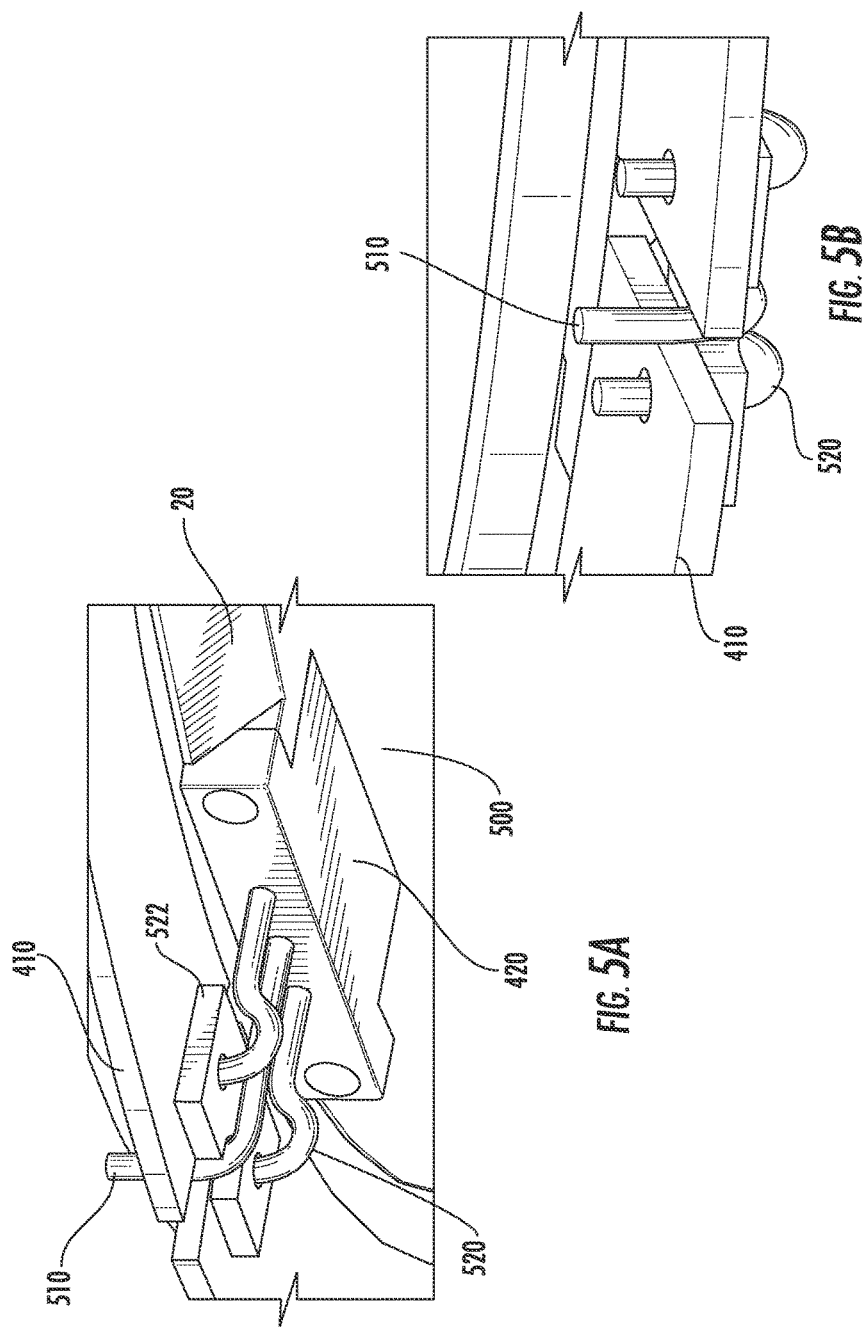

APPARATUS FOR IMPROVING TEMPERATURE UNIFORMITY OF A WORKPIECE

FIELD

Embodiments of the present disclosure relate to apparatus and methods for improving the temperature uniformity of a workpiece during processing, and more particularly, improving the temperature uniformity of a heated workpiece.

BACKGROUND

The fabrication of a semiconductor device involves a plurality of discrete and complex processes. To perform these processes, a workpiece is typically disposed on a platen. The platen may be an electrostatic chuck, designed to retain the workpiece through the application of electrostatic forces produced by electrodes within the platen.

Platens are typically designed to be slightly smaller in diameter than the workpieces that they support. This insures that the platen is not exposed to the incoming ion beam. Contact with the ion beam could cause the generation of contaminants, or may do damage to the platen.

In addition to retaining the workpiece in place, the platen may also serve to heat or cool the workpiece. Specifically, the platen is typically a larger mass of material, capable to drawing heat from the workpiece in some embodiments, or supplying heat to the workpiece in other embodiments. In certain embodiments, the platen has conduits on its upper surface that supply a back side gas to the space between the upper surface of the platen and the back surface of the workpiece.

Because the platen is somewhat smaller than the workpiece, the outer edge of the workpiece may not be heated or cooled as effectively by the platen. Thus, in embodiments where the platen supplies heat to the workpiece, the outer edge of the workpiece may be cooler than the rest of the workpiece. Conversely, in embodiments where the platen is removing heat from the workpiece, the outer edge of the workpiece may be hotter than the rest of the workpiece.

This difference in temperature may impact the yield of the workpiece. Therefore, it would be beneficial if there were an apparatus and method to achieve better temperature uniformity across a workpiece, especially in embodiments where the workpiece is heat by the platen.

SUMMARY

An apparatus and method for improving the temperature uniformity of a workpiece during processing is disclosed. The apparatus includes a ring heater assembly disposed along the outer circumference of the platen. The ring heater assembly includes heating elements disposed therein or thereon, where these heating elements create heat, which serves to warm the outer edge of the workpiece. In some embodiments, the ring heater assembly extends beyond the edge of the workpiece and may be exposed to the ion beam.

According to one embodiment, a workpiece holding and heating apparatus is disclosed. The apparatus comprises a platen; and a ring heater assembly surrounding an outer circumference of the platen, the ring heater assembly comprising a protective shield on a top surface and a heating element disposed beneath the protective shield. In a further embodiment, the heating element may be encased in the protective shield. In certain embodiments, the protective shield is a ceramic material. In certain embodiments, a mounting system holds the ring heater assembly in place and includes a plurality of flexures. In some embodiments, the mounting system connects to a based used to hold the platen. In certain embodiments, the ring heater assembly also includes a temperature sensor disposed near the top surface. In some embodiments, a power supply is in communication with the ring heater assembly.

According to another embodiment, a method of heating a workpiece is disclosed. The method comprises using conductive heating through the use of a back side gas to provide heat to a first portion of the workpiece; and using radiative heating to provide heat to a second portion of the workpiece. In certain embodiments, the second portion may be an outer edge of the workpiece.

According to another embodiment, a ring heater assembly is disclosed. The ring heater assembly comprises a ring shaped protective shield; a heating element disposed beneath the ring shaped protective shield; and a mounting system to place the ring shaped protective shield in place. In certain embodiments, the mounting system comprises a mounting frame in communication with a based and a plurality of flexures extending from the mounting frame toward the heating element.

BRIEF DESCRIPTION OF THE FIGURES

For a better understanding of the present disclosure, reference is made to the accompanying drawings, which are incorporated herein by reference and in which:

FIG. 4 is a view of the heating elements and the mounting frame according to one embodiment;

FIGS. 5A-B show the connection between the ring heater and the platen base according to one embodiment.

DETAILED DESCRIPTION

As described above, the edges of workpieces disposed on traditional platens may overhang the platen, causing these edges to maintain a different temperature than the rest of the workpiece.

Figure 1:
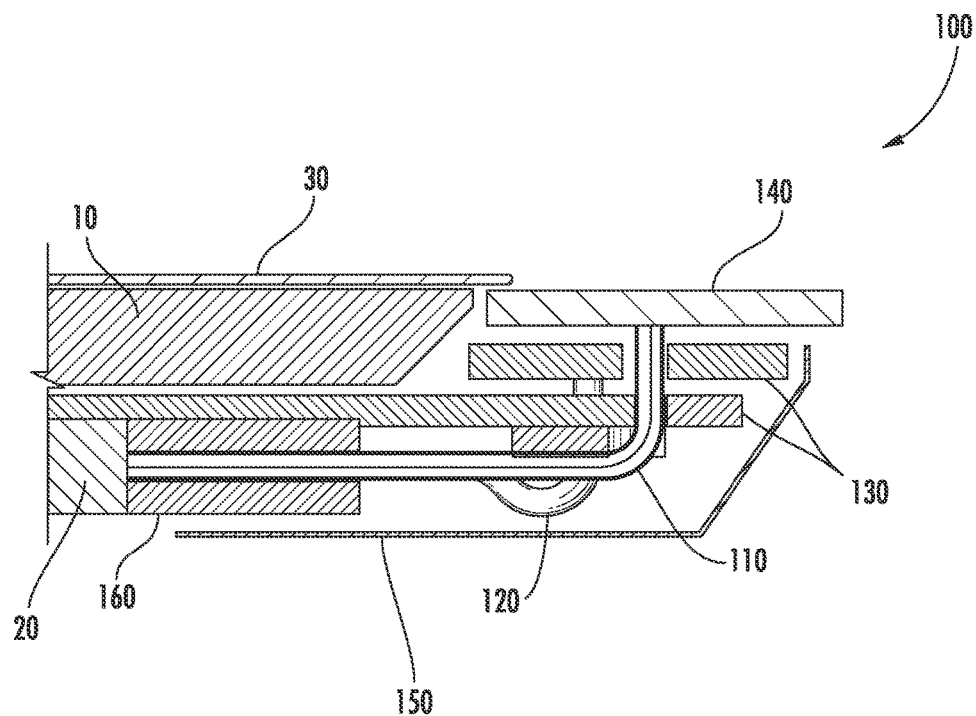
FIG. 1 is a view of a ring heater assembly according to one embodiment.

FIG. 1 shows a first embodiment of a ring heater assembly 100. In this embodiment, the ring heater assembly 100 is disposed proximate and surrounding the outer circumference of the platen 10. The platen 10 may be an electrostatic chuck (ESC), or any other type of platen. In some embodiments, the platen 10 comprises a plurality of conduits terminating on the upper surface of the platen 10, which deliver back side gas to the volume between the upper surface of the platen 10 and the bottom surface of the workpiece 30. The platen 10 may also have an outer seal ring (not shown) near its outer edge, which serves to confine the back side gas in this volume and minimize back side gas leakage. The outer seal ring extends upward from the upper surface of the platen 10 and contacts the workpiece 30, forming a wall that contains the back side gas. This outer seal ring is effective because it contacts the workpiece 30. Further, the platen 10 may include an upper dielectric layer, under which a plurality of electrodes is disposed. Alternating voltage waveforms may be applied to these electrodes, which create an electrostatic force that holds the workpiece 30 in place on the platen 10. This upper dielectric layer may be unable to withstand ion beam strike. Thus, because the outer seal ring contacts the workpiece 30, the platen 10 is typically smaller than the workpiece 30 which is disposed thereon, to insure that the ion beam cannot strike the platen 10. In some embodiments, the workpiece 30 may overhang the platen 10 by 2-3 mm, although other dimensions are also possible and within the scope of the disclosure.

The platen 10 may be disposed on a base 20, used to support the platen 10. The base 20 may be made of the different material than the platen 10. Extending outward from the base 20 is a mounting system, which may comprise one or more flexures 110. These flexures 110 are coupled to the base 20 on one end, and extend outward and upward past the edge of the platen 10. These flexures 110 may be any suitable material. In some embodiments, the flexures 110 may be tubes, in which electrical wires are disposed, as described in more detail below. In other embodiments, the flexures 110 may be solid, and the electrical wires 120 may be disposed outside of the flexures 110. These flexures 110 may connect to a mounting frame 160, which is used to hold the ring heater assembly 100 in place. The mounting frame 160 may also hold one or more heating elements 130 in place. The mounting frame 160 may be a block that may hold one end of the flexure 110 and connect it to the base 20. The connection between the mounting frame 160 and the flexure 110 may be a mechanical connection, such as a screw or clamp. Of course, other mounting systems may be used to hold the ring heater assembly 100 in place.

While FIG. 1 shows two layers of heating elements 130, the disclosure is not limited to any particular number of heating elements. These heating elements 130 may be protected by a protective shield 140. This protective shield 140 may be a ceramic material, although other materials may be used. The material for the protective shield 140 may be selected to be relatively impervious to the ion beam, such that it resists sputtering. Further, the material may be selected so that any sputtered material minimally contaminates the workpiece. Silicon carbide and graphite are such materials, although other materials may be used.

As shown in FIG. 1, the protective shield 140 may be disposed so that, when a workpiece 30 is disposed on the platen 10, the workpiece 30 does not contact the protective shield 140.

Additionally, a heat shield 150 may be disposed beneath the heating elements 130. This heat shield 150 serves to direct the heat generated by the heating elements 130 upward toward the protective shield 140 to maximize the heat transfer from the heating elements 130 to the protective shield 140. Since the heat shield 150 is not exposed to the ion beam, it may be constructed of a metal, although other material may also be used.

In operation, power is supplied through electrical wires 120 to the heating elements 130, which convert the electrical energy to heat. This heat is reflected upward by the heat shield 150 toward the protective shield 140. The protective shield 140 absorbs this heat, raising its temperature. The protective shield 140 then heats the workpiece 30 disposed above it via radiative heating.

To supply power, the ring heater assembly 100 is in communication with a power supply (not shown). In some embodiments, the power supply may be capable of supplying a variable output, such that the amount of heat produced by the heating elements 130 can be controlled. In certain embodiments, the outputs of the power supply are controlled using closed loop control, where a temperature sensor (not shown) is disposed on or near the ring heater assembly 100. In other embodiments, the temperature sensor may be embedded in the ring heater assembly 100. The power supply regulates the output based on the desired temperature of the ring heater assembly 100 and the actual temperature as measured by the temperature sensor. In another embodiment, the output of the power supply is calibrated so that a table that equates desired temperature to output level is created. This table is then used to determine the appropriate output of the power supply, based on the desired temperature.

FIG. 1 shows a ring heater assembly 100 having two layers of heating elements 130. However, other embodiments are also possible. For example, the heating elements 130 may be disposed within a ceramic or impregnated graphite material.

Figure 2:
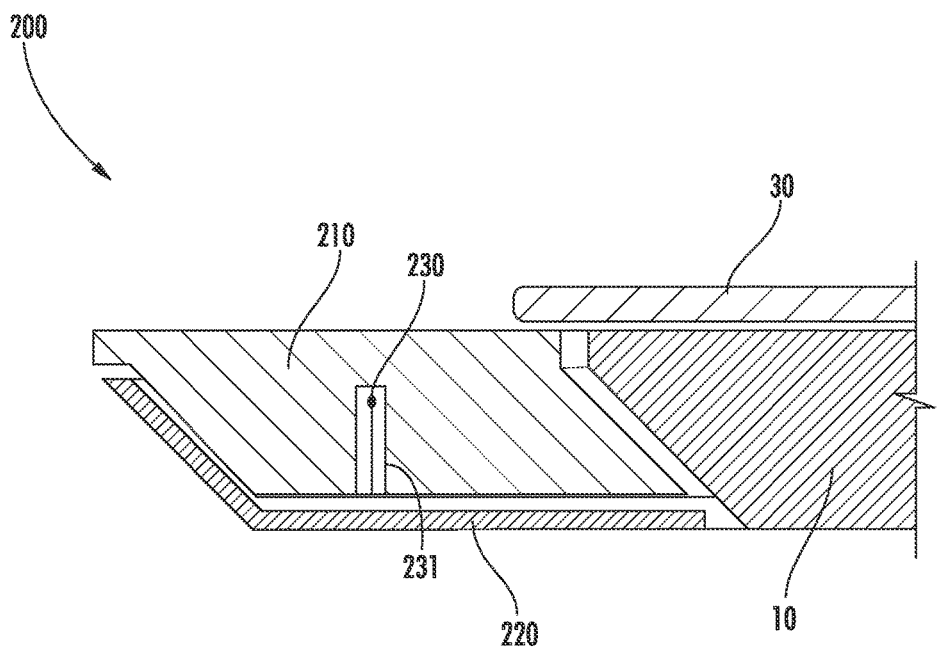
FIG. 2 is a view of a ring heater assembly according to another embodiment.

FIG. 2 shows another embodiment of a ring heater assembly 200. In this embodiment, the heating elements are encased in one or more ring heaters 210. The ring heater 210 may be a ceramic or impregnated graphite material, where the heating elements are disposed therein. In some embodiments, a separate protective shield is not used, as the material used to construct the ring heater 210 functions as the protective shield as well. In this embodiment, a heat shield 220 may be disposed on the underside of the ring heater 210. Note that, in this embodiment, the platen 10 has a tapered edge. In this embodiment, the ring heater 210 may be constructed to be flush, or nearly flush against the platen 10. If the platen 10 does not have a taper, the ring heater 210 may be constructed without this taper as well.

Though not shown, the heating elements within the ring heater 210 are in communication with a power supply, as described above.

Furthermore, the ring heater 210 may include a temperature sensor 230 disposed therein. The temperature sensor may be a thermocouple or a resistance temperature detector (RTD). In one embodiment, as shown in FIG. 2, a cavity 231 may drilled into the ring heater 210 so that the temperature sensor 230 may be inserted in the cavity 231. In some embodiments, the temperature sensor 230 is disposed close to the upper surface of the ring heater 210 to better determine the temperature near the workpiece 30.

Note that the workpiece 30 extends beyond the edge of the platen 10 and is disposed above a portion of the ring heater 210. This portion, referred to as the overhang portion, may vary. In some embodiments, only 2-3 mm of the workpiece comprise the overhang portion. However, in other embodiments, the platen 10 may be made smaller, relative to the workpiece, so that the overhang portion may be larger. For example, in some embodiments, the overhang portion may be as large as 15-20 mm. For example, FIG. 2 shows an overhang portion of about 2-3 mm. However, the diameter of the platen 10 may be decreased, such as by 5 mm, 10 mm, 15 mm, 20 mm, or 25 mm, while the width of the ring heater 210 is increased correspondingly. The overhang portion is not limited by the present disclosure.

Figure 3A:
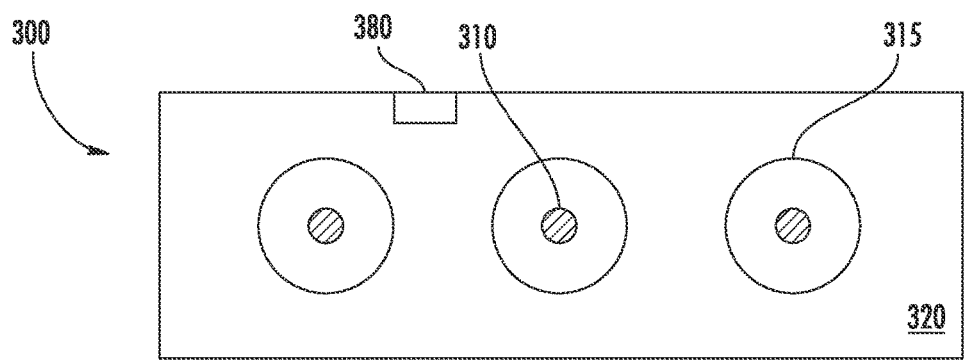
FIGS. 3A-B show different embodiments of the heating elements.

FIG. 3A shows an embodiment of a ring heater 300, which may be used in the embodiment shown in FIG. 2. In this embodiment, one or more heating elements 310 are disposed within an outer material 320. These heating elements 310 may be resistive wire heaters, designed to dissipate energy by the generation of heat. The outer material 320 may be ceramic, impregnated graphite or another material. In some embodiments, the heating elements 310 may be encapsulated in a metal tube 315 to physically separate them from the outer material 320. In some embodiments, the ring heater 300 may include a temperature sensor. As shown in FIG. 2, in some embodiments, a cavity may be drilled in the outer material 320 and a temperature sensor may be placed in the drilled cavity. In another embodiment, the temperature sensor 380 may be formed in the outer material 320, near the upper surface. Alternatively, a cavity could be formed in the top surface of the outer material 320, and the temperature sensor 380 may be placed in that cavity.

Figure 3B:
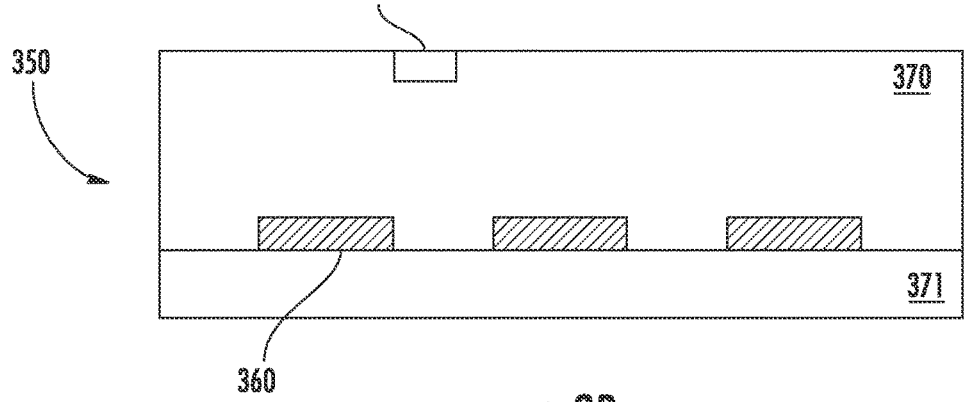

FIG. 3B shows another embodiment of a ring heater 350, which may be used in the embodiment shown in FIG. 2. In this embodiment, the heating elements 360 may be flat and may be encapsulated between a first layer 370 and a second layer 371. To produce this ring heater 350, the heating elements 360 may be silk screened, direct written or otherwise deposited on the second layer 371, which may be an unfired ceramic material. The first layer 370, which may also be an unfired ceramic material, is then placed on top of the second layer 371. The assembly then gets fired, or sintered, and becomes a monolithic piece of ceramic with an embedded heater. Again, a temperature sensor 380 may be embedded in the first layer 370, using any of the methods described above.

FIG. 4 shows an embodiment of the ring heater assembly 400, separated from the platen 10. In this embodiment, the ring heater assembly 400 is made up of three ring heaters 410, each being about ⅓ of the total circumference. If more ring heaters are used, each would be smaller than those shown in FIG. 4. The use of separate ring heaters 410 may allow for thermal expansion while minimizing thermal stress. Disposed between each adjacent pair of ring heaters 410 is the mounting frame 420. The mounting frame 420 holds a flexure (see FIG. 1) to support the ring heaters 410, and also provides electrical conduits, which supply power to the heating elements disposed within the ring heaters 410. Although not shown, the ring heaters 410 may be covered by a protective shield. The ring heaters 410 may be of the types shown in FIGS. 3A-3B, or any other suitable type.

FIG. 5A illustrates a bottom view of one embodiment of the connection between the ring heaters 410 shown in FIG. 4 and the base 20. FIG. 5B illustrates a top view of this embodiment. In this embodiment, the base 20 comprises one or more receptacles 500 to mate with mounting frame 420. In some embodiments, three or more receptacles 500 are equally disposed about the outer perimeter of the base 20. The mounting frame 420 may hold a flexure 510 to support the ring heaters 410. As stated above, the flexure 510 may be secured to the mounting frame 420 using a mechanical connection, such as a screw or clamp. In certain embodiments, the mounting frame 420 also comprises one or more electrical conduits 520, which supply power to the ring heaters 410. In certain embodiments, the electrical conduits 520 may be disposed in the flexure 510.

The flexure 510 may be connected to the ring heaters 410 in a variety of ways. In one embodiment, there may be a flange joined to the distal end of the flexure 510. The flange may be joined using high temperature brazing. A block 522 having a threaded feature may be attached to the underside of the ring heaters 410. The threaded feature accepts the flange. The connection between the flange and the threaded feature may be a threaded joint. The attachment of the block 522 to the ring heater 410 may be done in a variety of ways. In one embodiment, the ring heater 410 may be ceramic. In this embodiment, the block 522 may be metal and may be brazed to the ring heater 410. In another embodiment, the ring heater 410 may be graphite. In this embodiment, traditional threaded hardware may be used, as graphite can accept threads with inserts. In an alternate embodiment, the block 522 may be clamped around a machined feature on the bottom of the graphite ring heater. In another embodiment, a heat shield (see FIG. 2) is disposed under the ring heater 410. If this heat shield is metal, the flexure 510 may connect to the heat shield.

While FIGS. 4, 5A and 5B show one embodiment of a mounting frame 420 that can be used to attach the base 20 to the ring heater assembly, the disclosure is not limited to this embodiment. Other support mechanisms may be used to hold the ring heater assembly in place.

In all of these embodiments, the ring heater assembly is an annular ring that surrounds the outer circumference of the platen 10. The top of the ring heater assembly may be positioned so that it is slightly below the level of the top surface of the platen 10 to insure that the workpiece 30 does not contact the ring heater assembly.

In each embodiment, the ring heater assembly comprises a protective shield, which is disposed on the upper surface of the ring heater assembly. Because it is exposed to the ion beam, the protective shield may be made of ceramic or impregnated graphite or any suitable material that is resistant to sputtering.

Beneath the protective shield are one or more heating elements. These heating elements are typically resistive elements that are supplied with power from a power supply. The electrical energy passing through the heating elements is transformed into heat, which serves to heat the heating elements and the surrounding elements, such as the protective shield. In some embodiments, the heating elements are encased or encapsulated in a ceramic or graphite shell, which serves as the protective shield. In some embodiments, a temperature sensor is embedded or other affixed to the shell or outer material.

Disposed beneath the heating elements may be a heat shield, which reflects the heat toward the upper surface of the ring heater assembly. This heat shield may be metal, as it is not exposed to the ion beam.

Additionally, the ring heater assembly may be held in place through the use of a mounting system. In some embodiments, the mounting system comprises a plurality of flexures extending from the base. However, other mounting systems may also be used.

Finally, the ring heater assembly may be in communication with a power supply, which powers the heating elements. As described above, the power supply may be capable of supplying a variable output, such that the amount of heat produced by the heating elements can be controlled. In certain embodiments, the outputs of the power supply are controlled using closed loop control, where a temperature sensor is disposed on or near the top surface of the ring heater assembly. In this embodiment, a controller (not shown) may be in communication with the temperate sensor and the power supply. The controller may also receive inputs regarding the desired temperature of the ring heater assembly. The controller then uses the input from the temperature sensor to adjust the output of the power supply. This may be done so that the temperature of the ring heater assembly matches that of the platen. In another embodiment, the output of the power supply is controlled by a controller using a table that equates desired temperature to output level. In this embodiment, the controller receives an input regarding the desired temperature of the ring heater assembly. The controller then indexes into the table to determine the appropriate output from the power supply.

In some embodiments, the ring heater assembly is used in situations where the workpiece is to be heated above the ambient temperature. As explained above, in traditional platens, the workpiece overhangs the edge of the platen by about 2-3 mm. Additionally, the outer seal ring may be disposed several millimeters before the edge of the platen. As described above, the outer seal ring provides a barrier that contains the back side gas between the workpiece 30 and the platen 10. This back side gas provides a heating mechanism between the platen and the workpiece, as the back side gas is heated by the platen and transfers that heat to the workpiece. In other words, the platen 10 provides conductive heating through the use of back side gas. Thus, the portion of the workpiece 30 that extends beyond the outer seal ring is not effectively heated by the platen 10 and the back side gas. In fact, in one example, the platen 10 was heated so as to maintain the workpiece 30 at 600° C. While most of the workpiece 30 was maintained at this temperature, the outer portion of the workpiece 30 was not. In fact, in one example, the outer edge of the workpiece 30 was 50° C. cooler than the rest of the workpiece 30.

The scenario above was repeated with the ring heater assembly mounted around the platen. In this example, the temperature of the outer edge of the workpiece 30 was within 5° C. of the rest of the workpiece 30, demonstrating the effectiveness of this approach.

The ring heater assembly heats the workpiece through radiative heating, as there is no contact between the ring heater assembly and the workpiece 30. Further, there is no back side gas in the space between the ring heater assembly and the workpiece 30.

In certain embodiments, the diameter of the platen 10 relative to the workpiece may be reduced due to the presence of a ring heater assembly. As described above, in some embodiments, the overhang portion of the workpiece 30 may be 2-3 mm. However, in certain embodiments, the overhang portion may be increased to 10 mm, 15 mm, 20 mm, or even greater values. This approach may add structural rigidity to the ring heater assembly and have no effect on the overall temperature profile on the workpiece 30.

Figure 6A:
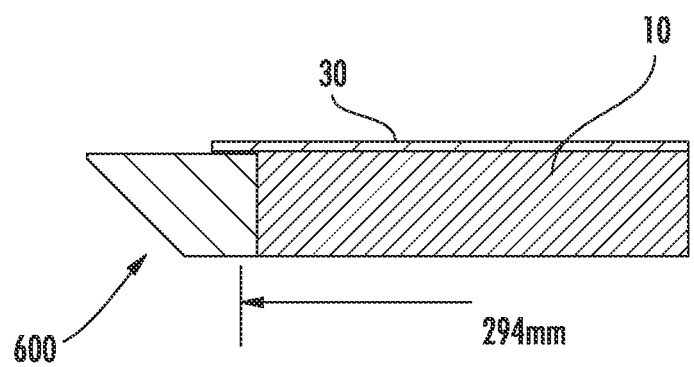
FIGS. 6A-C show various embodiments having different overhang portions.
Figure 6B:
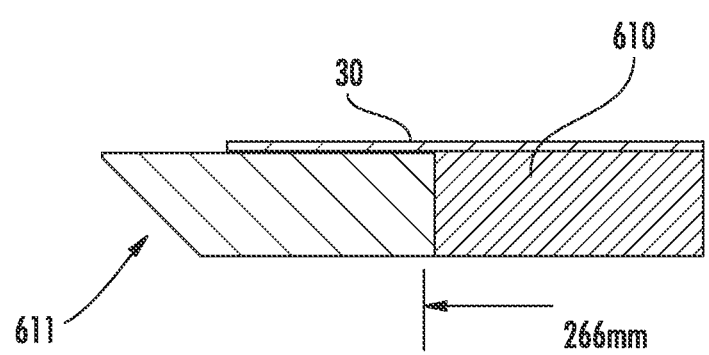
Figure 6C:
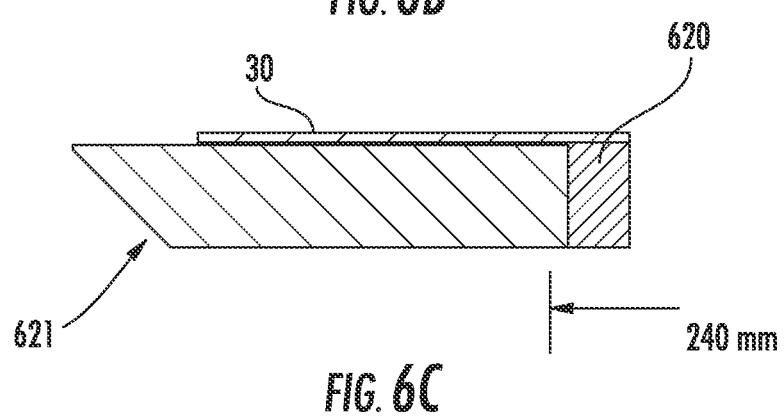

FIGS. 6A-C shows various embodiments having different overhang portions. Note that in these embodiments, the edge of the platen is not tapered. Thus, in these embodiments, the inner circumference of the ring heater is straight and aligned to the platen.

In FIG. 6A, the overhang portion is about 2-3 mm. In other words, about 2-3 mm of the workpiece 30 are disposed above the ring heater 600. In one embodiment, the workpiece 30 may have a diameter of 300 mm, while the platen 10 has a diameter of about 295 mm. In this embodiment, the ring heater 600 may have a width of between about 7 and 22 mm.

In FIG. 6B, the overhang portion is about 17 mm. In this embodiment, the workpiece 30 may have a diameter of 300 mm, while the platen 610 has a diameter of about 266 mm. In this embodiment, the ring heater 611 may have a width of between about 22 and 35 mm.

In FIG. 6C, the overhang portion is about 30 mm. In this embodiment, the workpiece 30 may have a diameter of 300 mm, while the platen 620 has a diameter of about 240 mm. In this embodiment, the ring heater 621 may have a width between about 35 and 50 mm.

In each of these embodiments, the outer diameter of the ring heater is unchanged and is related to the outer diameter of the workpiece 30. The inner diameter of the ring heater changes, based on the outer diameter of the platen. The outer diameter of the ring heater may extend beyond the outer diameter of the workpiece 30 by any amount. In some embodiment, increasing the outer diameter of the ring heater past that of the workpiece 30 reduces the heat lost at the outer edge of the workpiece 30. In some embodiments, the outer diameter of the ring heater is selected to as to extend at least 5 mm past the outer edge of the workpiece 30. In other embodiments, the outer diameter of the ring heater may extend more than 20 mm past the outer edge of the workpiece. Of course, other relationships between the diameter of the workpiece 30 and the outer diameter of the ring heater may be used. For example, the outer diameter of the ring heater may be selected so as to optimize the radiative heat lost at the edge of the workpiece 30 and the overall size of the ring heater.

Thus, in one embodiment, the ring heater assembly is part of a workpiece holding and heating apparatus. The workpiece holding and heating apparatus includes a platen and a ring heater assembly, which surrounds the outer circumference of the platen. The platen heats the workpiece with conductive heating using back side gas. The platen also may hold the workpiece in place through the use of electrostatic forces. The ring heater assembly, which is an annular ring surrounding the platen, heats the workpiece using radiative heating. This combination is effective is creating a more uniform temperature profile across the entirety of the workpiece than can otherwise be created.

While the disclosure describes the use of the ring heater with a heated platen, the disclosure is not limited to this embodiment. For example, in some embodiments, an ion implant may be performed at room temperature. However, even at room temperature, there may be some change in the temperature of the workpiece near its outer circumference, where the outer edge of the workpiece may be cooler than the rest of the workpiece. The use of the ring heater assembly may minimize this temperature roll off at the outer edge.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece holding and heating apparatus, comprising:
   a platen;
   a base supporting the platen;
   a ring heater assembly surrounding an outer circumference of the platen, the ring heater assembly comprising a protective shield on a top surface and a plurality of heating elements disposed beneath the protective shield, each heating element disposed in a respective ring heater; the plurality of ring heaters forming an annular ring;
   a plurality of mounting frames, each in contact with the base, to hold the ring heater assembly in place;

a plurality of blocks attached to an underside of the ring heater assembly, each block disposed between two adjacent ring heaters so as to support the two adjacent ring heaters;

a plurality of flexures extending outward from each mounting frame and connecting to a respective one of the plurality of blocks used to support the ring heater assembly, wherein the plurality of flexures are curved and extend outward and upward from the mounting frame past the outer circumference of the platen, and wherein the base is not disposed beneath the ring heater assembly and the plurality of flexures provides the only mechanical support for the ring heater assembly; and electrical conduits, different from the flexures, to provide power to the ring heater assembly.

2. The apparatus of claim 1, wherein each heating element is encased in the protective shield.

3. The apparatus of claim 2, wherein the protective shield is a ceramic material.

4. The apparatus of claim 1, further comprising a power supply in communication with the ring heater assembly.

5. The apparatus of claim 4, further comprising a temperature sensor disposed near the top surface of the ring heater assembly, wherein the power supply controls an output based on feedback from the temperature sensor.

6. The apparatus of claim 4, wherein the power supply regulates an output based on a desired temperature.

7. The apparatus of claim 1, wherein the base comprises receptacles disposed about a perimeter of the base, wherein the plurality of mounting frames mates to the base using the receptacles.

8. The apparatus of claim 1, wherein the flexures attach to the block using a threaded connection.

9. The apparatus of claim 1, wherein the flexures comprise tubes.

10. The apparatus of claim 1, wherein the electrical conduits are disposed in one of the plurality of flexures.

11. The apparatus of claim 1, further comprising a heat shield disposed beneath the ring heater assembly.

12. The apparatus of claim 1, wherein the platen is heated.

13. The apparatus of claim 12, wherein the platen comprises a plurality of conduits terminating at a upper surface of the platen to supply back side gas to a volume between the platen and a workpiece disposed on the platen.

14. The apparatus of claim 1, wherein the blocks are metal and brazed to the ring heaters.

15. The apparatus of claim 1, wherein the ring heaters are graphite, and the blocks are attached to the ring heaters using threaded hardware.

16. The apparatus of claim 1, wherein the blocks are clamped around a machined feature disposed on the bottom of the ring heaters.

17. The apparatus of claim 1, wherein there are at least three ring heaters.

* * * * *